United States Patent [19]

Wikswo, Jr. et al.

[11] Patent Number: 5,444,372
[45] Date of Patent: Aug. 22, 1995

[54] MAGNETOMETER AND METHOD OF MEASURING A MAGNETIC FIELD

[75] Inventors: John P. Wikswo, Jr., Brentwood, Tenn.; William C. Black, Jr., Del Mar, Calif.; Eugene C. Hirschkoff, Leucadia, Calif.; James R. Marsden, San Diego, Calif.; Douglas N. Paulson, Del Mar, Calif.

[73] Assignee: Biomagnetic Technologies, Inc., San Diego, Calif.

[21] Appl. No.: 919,599

[22] Filed: Jul. 22, 1992

[51] Int. Cl.6 .......................................... G01R 33/035
[52] U.S. Cl. ..................... 324/248; 324/262; 505/846
[58] Field of Search .............. 324/248, 262, 244, 247, 324/260, 261; 505/842-846; 307/306

[56] References Cited

U.S. PATENT DOCUMENTS

| | | | |
|---|---|---|---|
| 3,689,836 | 9/1972 | Snyder | 324/252 X |
| 4,030,204 | 6/1977 | Edwards | 324/251 X |
| 4,163,326 | 8/1979 | Edwards | 324/251 X |
| 4,197,855 | 4/1980 | Lewin . | |
| 4,437,064 | 3/1984 | Overton, Jr. . | |
| 4,489,274 | 12/1984 | Berlincourt . | |
| 4,613,816 | 9/1986 | Zeamer | 324/248 X |
| 4,749,946 | 6/1988 | Hoenig | 324/248 |
| 5,019,777 | 5/1991 | Gulliver et al. | 324/262 |
| 5,038,104 | 8/1991 | Wikswo, Jr. . | |
| 5,109,196 | 4/1992 | Wikswo, Jr. . | |

FOREIGN PATENT DOCUMENTS

| | | |
|---|---|---|
| 0238209 | 9/1987 | European Pat. Off. . |
| 63-131083 | 6/1988 | Japan ................... 324/248 |
| 2224575 | 5/1990 | United Kingdom . |
| WO89/12833 | 12/1989 | WIPO . |

OTHER PUBLICATIONS

John Clarke, "SQUIDs, brains and gravity waves," *Physics Today*, vol. 39, No. 3, pp. 36–44 Mar. 1986.
John P. Wikswo, Jr. et al., "Application of Superconducting Magnetometers to the Measurement of the Vector Magnetocardiogram," *IEEE Trans. Magnetics*, vol. MAG–13, pp. 354–357 (1977).
John P. Wikswo, Jr., "Optimization of SQUID Differential Magnetometers," in Future Trends in Superconductive Electronics, B. S. Deaver, Jr. et al. editors. AIP Conference Proceedings, No. 44, pp. 145–149 (1978).
Bradley J. Roth et al., "Apodized pickup coils for improved spatial resolution of SQUID magnetometers," *Rev. Sci. Instrum.*, vol. 61(9), pp. 2439–2448 (1990).

*Primary Examiner*—Sandra L. O'Shea
*Assistant Examiner*—Warren S. Edmonds
*Attorney, Agent, or Firm*—Gregory Garmong

[57] ABSTRACT

A magnetometer includes a support. The support has two support surfaces that intersect each other along an intersection line. The intersection line is perpendicular to a reference axis of the support. The support surfaces are preferably perpendicular to each other and are each inclined at an angle of 45 degrees to the reference axis. A planar sensor/detector array is mounted on each support surface. Each array includes at least two pairs of magnetic field sensors and associated SQUID detectors arranged such that the magnetic field sensors lie on a line that is parallel to the intersection line of the two support surfaces. The magnetometer can be used adjacent to a surface to measure components and spatial variation of the magnetic field near the surface, with the measured components resolved into the magnetic field vectors parallel to and perpendicular to the surface.

19 Claims, 3 Drawing Sheets

MAGNETOMETER AND METHOD OF MEASURING A MAGNETIC FIELD

BACKGROUND OF THE INVENTION

This invention relates to the measurement of a magnetic field, and, more particularly, to an apparatus and method for measuring the vector components and spatial variation of a magnetic field.

Many types of objects emit magnetic fields that can be measured externally to the object, using a device called a magnetometer. Magnetic measurements are noninvasive, permitting an understanding of the interior of the object without physical penetration of the object. In an example drawn from the field of biomagnetism, the human brain and heart produce magnetic fields that extend outside the body. The measurement of these fields provide an indication of the operation of the measured organ, without physical penetration or radiation of the body. In an example from another field, nondestructive evaluation, defects in objects such as pieces of metal can be located by measuring magnetic fields external to the object. Anomalies in the measured field may be traced to defects within the metal.

The magnitude of external magnetic fields produced by a body generally decrease rapidly with increasing distance from the body. Particularly if the magnetic field is initially small, it is important to place the magnetometer close to the surface of the body and/or to use a very sensitive magnetometer. The most sensitive magnetometers now available are those using a magnetic field sensor such as a wire loop that produces a small electrical current when magnetic flux penetrates the loop, and a Superconducting Quantum Interference Device (SQUID) that detects the small electrical current.

The application of magnetometer and magnetic sensing techniques to nondestructive evaluation and other analytical purpose is often limited by the available sensitivity and spatial resolution of the sensor systems. To permit the SQUID to operate, as well as to obtain the most sensitivity and highest signal-to-noise ratio, the magnetometer is cooled to superconducting temperatures, and typically to liquid helium temperature (4.2 K.). The magnetometer is placed into a cryogenic dewar to achieve the cooling. As a rule, the thickness of the dewar walls and the configuration of the dewar limit how closely the magntic field sensor may be placed to the surface of the object being measured. Consequently, the spatial resolution and sensitivity of the sensor/SQUID detector are limited as well.

There exists a need for an improved approach to measuring magnetic fields using sensors and SQUID detectors. The approach should be capable of measuring the vector components of the magnetic field and the spatial variation in those components. It should also permit the sensors to be placed very close to the surface of the object. The present invention fulfills this need, and further provides related advantages.

SUMMARY OF THE INVENTION

The present invention provides a magnetometer using various types of sensors and detectors, including but not limited to pickup coils and SQUID detectors, and has high inherent sensitivity. The sensors are arranged so that they can be placed very close to the surface of an object being measured. All three vector components of the magnetic field may be measured, as well as their spatial variation. The magnetometer thereby achieves a combination of high instrument sensitivity and also good spatial sensitivity due to the closeness of the sensors to the object being measured. The magnetometer can be made using existing manufacturing techniques, and operated using known SQUID instrumentation, where a SQUID is used as the detector.

In accordance with the invention, a magnetometer comprises a support having a reference axis and two planar support surfaces that intersect along an intersection line that is not parallel to the reference axis. There are two planar sensor/detector arrays, one array mounted on each support surface. Each array includes at least two pairs of magnetic field sensors and associated detectors. The arrays of sensors and their associated detectors are preferably fabricated by known thin-film manufacturing techniques, which permit as many elements in the array as necessary for a particular requirement, and permit those elements to be precisely positioned and closely spaced. The detectors preferably, but not necessarily, include superconducting quantum interference devices (SQUIDs).

In a preferred form, the magnetometer comprises a support having a reference axis and two support surfaces that intersect each other along an intersection line that is perpendicular to the reference axis. The support surfaces are perpendicular to each other and are each inclined at an angle of 45 degrees to the reference axis. There are two planar sensor/detector arrays, one array mounted on each support surface. Each array includes at least two pairs of magnetic field sensors and associated detectors arranged such that the magnetic field sensors lie on a line that is parallel to the intersection line of the two support surfaces.

In the preferred form wherein the detector is a SQUID detector, the support is preferably made in the form of an internally cooled "cold finger" with the sensor/detector arrays on the external support surfaces of the cold finger. The arrays are cooled by conduction to the interior of the support, and thereby are maintained at a temperature at which the sensors and SQUID detectors are superconducting.

The geometry of the preferred form of magnetometer is particularly conducive to direct measurements of the component of the magnetic field or field gradient perpendicular to the surface of the object being measured, as it is the sum of the two measured components from the respective sensors of the two arrays, when placed at the same location in space. The component of the magnetic field parallel to the plane of the surface, and perpendicular to the line of intersection of the planes, is the difference of the two measured components. Based upon the ability to measure these two components and the ability to move the magnetometer relative to the surface, the vector components of the magnetic field and their spatial variation may be determined.

The present invention therefore provides a geometry for a magnetometer that is conducive to the use of inexpensive, functional sensor/detector arrays, while attaining measurements of the vector components of magnetic fields and their spatial variation and gradients. Other features and advantages of the invention will be apparent from the following detailed description of the preferred embodiment, taken in conjunction with the accompanying drawings, which illustrate, by way of example, the principles of the invention.

DETAILED DESCRIPTION OF THE PREFERRED EMBODIMENT

Figure 1:
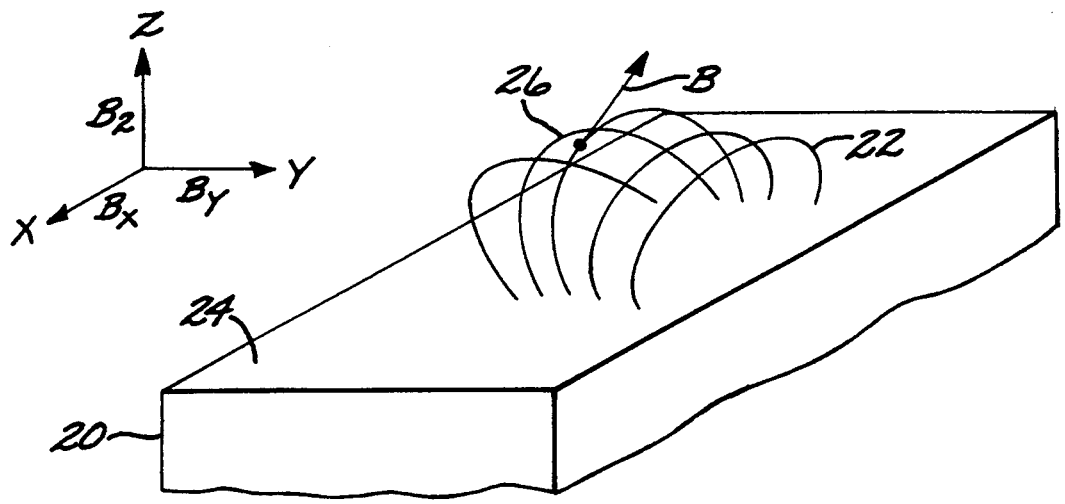
FIG. 1 is a schematic illustration of a magnetic field and its vector components, near to a surface.

Before discussing the preferred embodiment, it is useful to review the vector nature of a magnetic field. FIG. 1 illustrates an object 20, with a magnetic field 22 emanating from its surface 24. At any selected location, denoted by numeral 26, the magnetic field can be viewed as a magnetic field vector B having a magnitude and an orientation in space. The vector B can be resolved along x, y, and z axes, shown in FIG. 1, as components $B_x$, $B_y$, and $B'_z$, using conventional vector analysis and according to the relation $B = B_x + B_y + B_z$.

In most instances of interest, the magnetic field is not uniform, so that a $B^a$ determined at a location "a" will be different from $B^b$ determined at another nearby location "b". Once the values of B are measured throughout a region, a map of the spatial variation of B, as well as the spatial variation of the resolved components $B_x$, $B_y$, and $B_z$, can be prepared. Another way to characterize the variation of the magnetic field at a single location is the rate of change of the magnetic field at that location. Because both the direction and magnitude of the magnetic field vector may change from location to location, the most meaningful way to describe the spatial rate of change is the terms of the vector components. The gradient of the magnetic field may be measured from measurements of the field at two closely spaced locations a and b, resolving the B vector at each location, and writing the spatial rate of change $(\partial B_x/\partial x)$ as $(B_x^b - B_x^a)/(b_x - a_x)$, where $B_x^b$ is the value of the x component of B at location b, and $b_x$ is the x value of location b according to some established set of coordinate axes. In a similar manner, it is possible to define other variations, such as, for example, the variation of the z component of B in the y direction, or $(\partial B_z/\partial y)$. When studying the magnetic fields near a surface, it is helpful to know the vector magnitudes $B_i$ and the rates of change $(\partial B_i/\partial j)$, where i and j may be x, y, or z.

Figure 2:
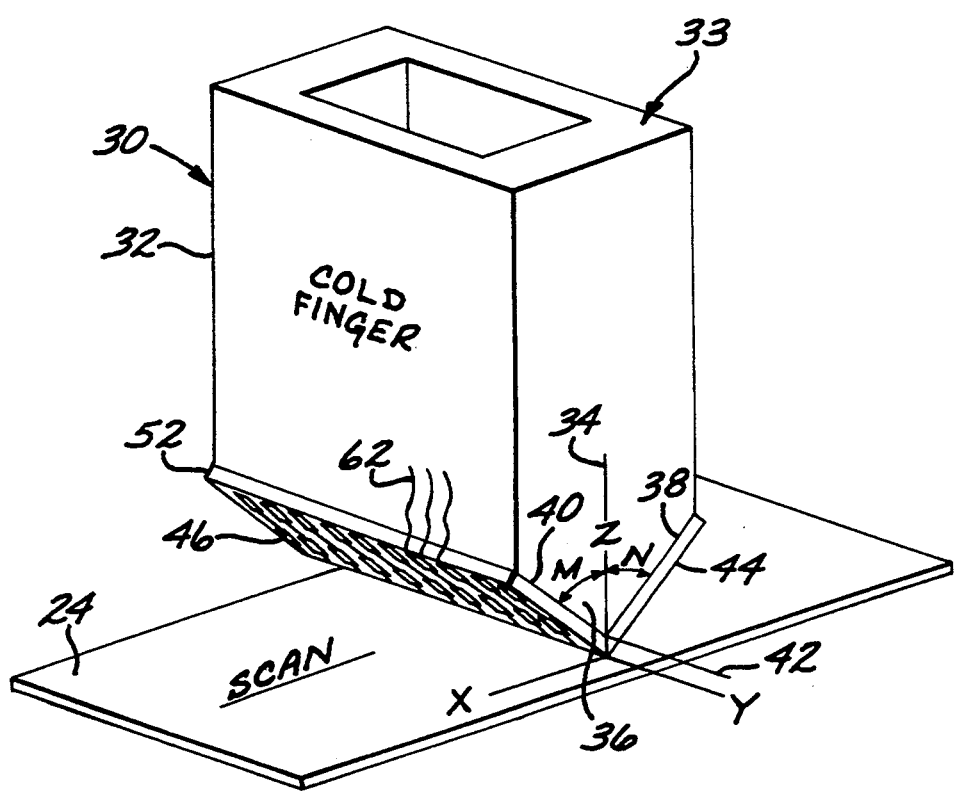
FIG. 2 is a perspective view of a magnetometer in accordance with the invention.

FIG. 2 illustrates a magnetometer 30 with which these various magnetic field vectors, maps of magnetic field vector spatial spatial variation, and magnetic field vector spatial rates of change can be measured directly or calculated from the measurements. The magnetometer 30 comprises a support 32 that includes a thin-walled container 33. In operation, the container 33 is filled with a liquefied gas such as helium or nitrogen (when high temperature superconductors are used in the sensor/detector elements). Equivalently, a mechanical cooler may be used to cool the support 32. If necessary, a cryogenic vessel may surround the magnetometer system for further cooling, but it is preferred not to use such a container because the sensor must necessarily be spaced farther from the source of the magnetic field.

The support 32 is illustrated adjacent a surface 24 whose nearby magnetic fields are to be measured. The surface has a reference x, y, z coordinate system superimposed, with the x and y axes lying in the plane of the surface 24, and the z axis lying perpendicular to the plane of the surface 24. The support 32 has a reference axis 34 that is depicted for convenience as coinciding with the z axis of a reference coordinate system, but which is not so restricted.

At a lower end 36 of the support 32, there are two planar support surfaces 38 and 40. The support surfaces 38 and 40 intersect along a line of intersection 42 that lies parallel to the y axis in the illustration of FIG. 2. In the preferred embodiment, the angle between the plane of the support 32, the angle M, is 45 degrees. The angle between the plane of the support surface 40 and the reference axis 34 of the support 32, the angle N, is 45 degrees. The angle between the two surfaces 38 and 40 therefore is 90 degrees, and the surfaces 38 and 40 are perpendicular to each other with a line of intersection 42. The angles M and N can be selected to be other values, but values of 45 degrees for both M and N are preferred for simplicity in making calculations and in achieving symmetry of the apparatus.

Figure 3:
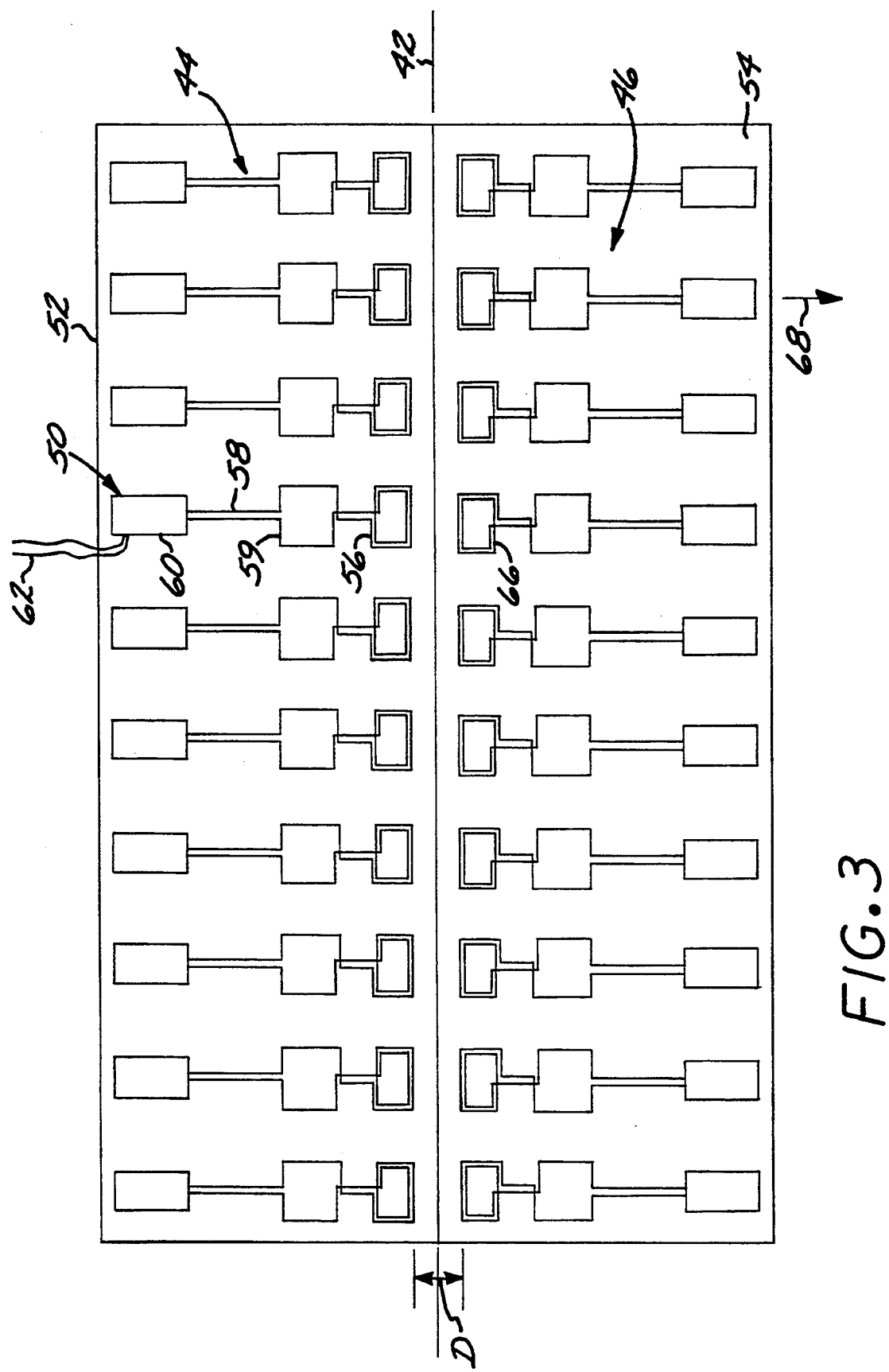
FIG. 3 is a plan view of the end of the magnetometer of FIG. 2.

Two planar sensor arrays 44 and 46 are fixed to the underside of the planar support surfaces 38 and 40, respectively. The array 46 is visible in FIG. 2, but the array 46 is not visible other than along its edge, due to the perspective. However, both arrays are shown clearly in a view from below, FIG. 3.

Each array 44, 46 is formed of a number of sensor/detector elements 50, arranged symmetrically about the line of intersection 42, and supported on substrates 52, 54, respectively. Each sensor/detector element 50 includes a magnetic field sensor 56, which is in the form of a loop of electrical conductor. The several magnetic field sensors that lie on the substrate 52 are preferably arranged in a straight line parallel to the line of intersection 42.

A pair of conductors 58 leads from the loop to a device for measuring either the current or voltage induced in the pickup coil loop, preferably in the illustrated embodiment a Superconducting Quantum Interference Device (SQUID) 60 (the element 60 including the on-chip electronics). Optionally and as depicted, a background suppression loop 59 of equal but opposite sensitivity to that of the sensor 56 can be provided between the sensor 56 and the SQUID 60 along the length of the conductors 58 to account for magnetic fields whose origins are far away (the earth's field, for example), so that the sensor/detector element becomes a gradiometer. There is one SQUID 60 for each sensor 56. A lead system 62 extends from the SQUID 60 to its external electronics 64, shown in FIG. 4.

The structure and operation of such sensor/detector elements 50, as well as the external SQUID electronics 64, are well known. Descriptions are of the structure, operation, and use of sensor/detector elements are provided in U.S. Pat. Nos. 3,980,076; 4,079,730; 4,386,361; 4,403,189, 5,038,104, and 5,109,196, whose disclosures are incorporated by reference. The present invention relates to the utilization of the sensor/detectors, not in their structure and operation. However, it should be noted that the magnetic field sensor loops 56 can be made as small as about 0.01 millimeters on a side, and spaced apart by comparable amounts if desired, by using microelectronic techniques and still be useful in measuring the magnetic fields. However, the smaller the area of the loop, the lower the sensitivity of the magnetometer. Equivalently, it is possible to maintain the net magnetic flux through each pickup coil constant using external feedback circuitry, thereby minimizing cross talk between adjacent pickup coils. The signal of the pickup coil is measured by the magnitude of the feedback signal. The sensors 56 and 66, and the SQUIDs 60, may be formed of conventional low-temperature superconductors such as niobium. Alternatively, they may be fabricated from high-temperature superconductor materials such as $YBa_2Cu_3O_7$, as described in U.S. Pat. No. 5,061,680 whose disclosure is incorporated by reference. In the present case, the sensor and the SQUIDs would typically be fabricated from the same materials, although they could be fabricated from different materials and physically separated in different temperature regions, as described in the '680 patent.

Figure 4:
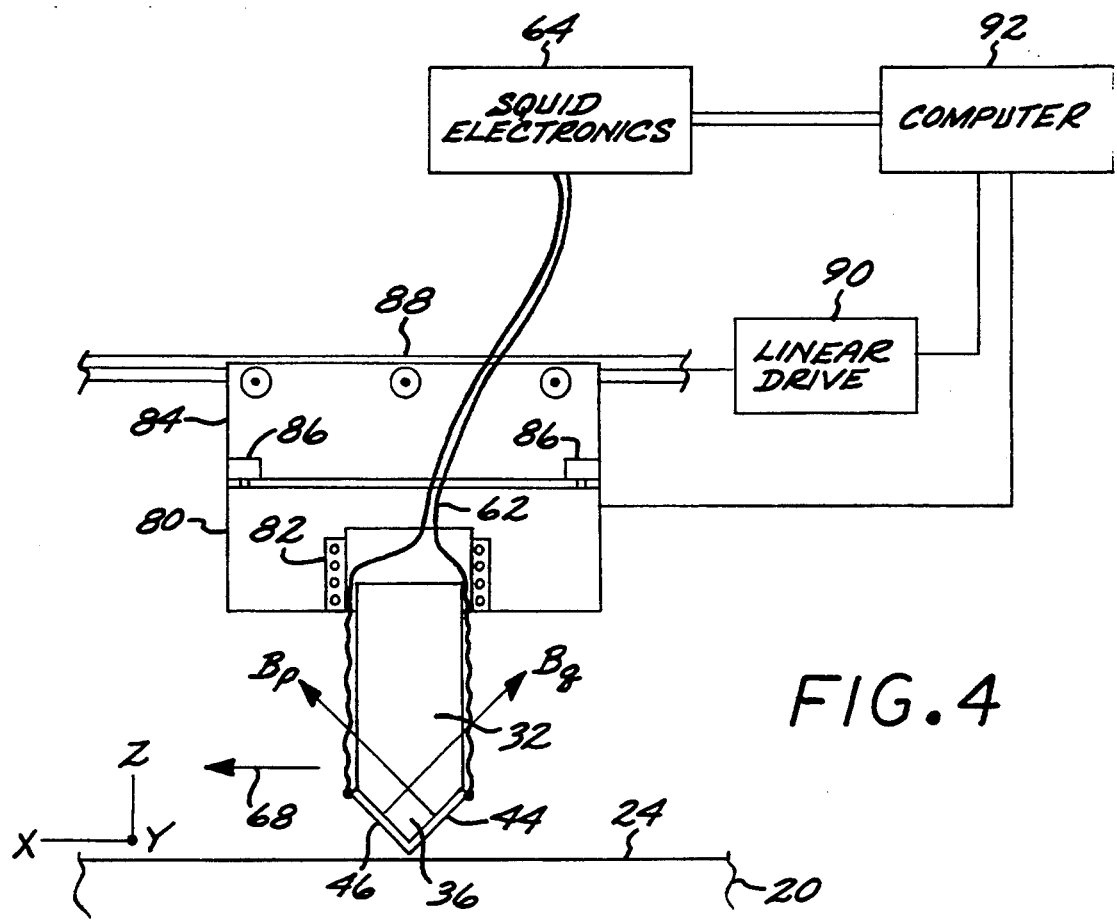
FIG. 4 is a schematic view of a magnetometer system utilizing the magnetometer of the invention.

The component of the local magnetic field 22 near the surface 24 that lies perpendicular to the array 44, represented by vector $B_p$ in FIG. 4, is detected by the magnetic field sensor 56 on the substrate 52. The component of the local magnetic field 22 that lies perpendicular to the array 46, represented by vector $B_q$, is detected by a symmetrically located sensor 66 on the substrate 54. Since there are a number of the sensor/detector elements 50 arrayed along the width (in the y direction) of the support 32, values of $B_p$ and $B_q$ along the entire width can be obtained simultaneously.

The loops 56 and 66 are not exactly coincident, with a distance D of typically about 1–2 millimeters between their centers. To obtain precisely located and associated values of $B_p$ and $B_q$, a measurement of $B_q$ is made using the magnetic field sensor loop 66. The support 32 is moved in the x direction by an amount D, indicated by arrow 68, and a measurement of $B_p$ is made using the magnetic field sensor 56. The values of $B_q$ before the movement and $B_p$ after the movement, for all of the symmetrically related pairs 56, 66 of sensor/detector elements, are used in subsequent calculations.

To permit movement of the sensor/detector elements relative to the surface 24 being measured, a drive system as illustrated in FIG. 4 is provided. The support 32 is mounted on a lower base 80 by bearings and a controllable vertical drive 82 that permits the support 32 to be raised and lowered parallel to the z axis. The lower base 80 is rotationally mounted to an upper base 84 by bearings and a controllable rotational drive 86, to permit the support 32 to be rotated relative to the surface 24 about the z-axis. If the support 32 is rotated 90 degrees about the z-axis, the magnetometer arrays would then measure the y and z components of the magnetic field along a line parallel to the x-axis. This result contrasts with the approach described in J. P. Wikswo et al., "Application of Superconducting Magnetometers to the Measurement of the Vector Magnetocardiogram", *IEEE Tran. Magnetics*, MAG-13, pages 354–357 (1977).

The upper base 84 is suspended by bearings from a track 88 that permits the support 32 to be moved parallel to the x-axis by an x-axis drive 90. (In turn, the track 88 and the x-axis linear drive 90 are suspended from another track, not shown, oriented at 90 degrees to the track 88, so that the support 32 may be moved parallel to the y-axis in the event that the surface to be measured is wider in the y axis than the width of the arrays 44 and 46.) In practice, the drive mechanisms are constructed from components that permit a high degree of spatial resolution in the driving, such as piezoelectric drives. Equivalently, the surface 24 being measured may be moved relative to the sensor/detector elements.

The various drives 82, 86, 90, and the y-axis drive are controlled by a computer 92. The computer 92 supervises the taking of magnetic field data from the sensor/detector elements 50 by the SQUID electronics 64. The computer also performs magnetic field calculations using the data gathered on $B_p$ and $B_q$ to develop the values of the magnetic field component vectors, spatial maps of vector components, and spatial gradients.

Figure 5:
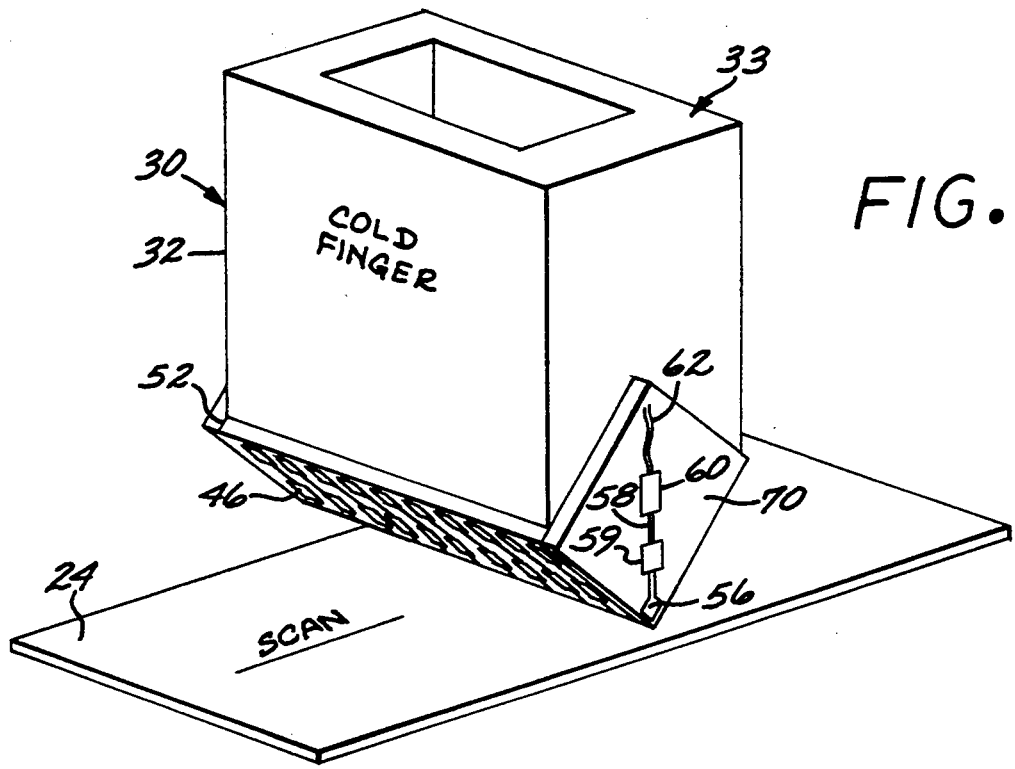
FIG. 5 is a perspective view similar to that of FIG. 2, except showing an additional gradiometer arrangement.

FIG. 5 depicts a variation of the approach of FIG. 2. In this embodiment, at least one magnetic field sensor 56 is placed on each end 70 of the support 32 at a right angle to the arrays 44 and 46. (A second sensor 56 is out of view in FIG. 5 at the opposite end from the end 70.) An associated conductor 58, detector (here a SQUID 60) and leads 62 are deposited on that same face. This arrangement permits the measurement of the magnetic field gradient in the y direction.

In accordance with the methodology of the invention, a method for measuring the vector components and spatial gradients of a magnetic field comprises the step of first providing a magnetometer including a support having a reference axis and two support surfaces that intersect each other along an intersection line that is perpendicular to the reference axis, are perpendicular to each other, and are each inclined at an angle of 45 degrees to the reference axis. There are two planar sensor/detector arrays, one array mounted on each support surface, each array including at least two pairs of magnetic field sensors and associated SQUID detectors arranged such that the magnetic field sensors lie on a line that is parallel to the intersection line of the two support surfaces. To make measurements, the magnetometer is moved relative to a magnetic field and measurements of the magnetic field are made using the sensor/detector arrays. Equivalently, the article being measured is moved. Equivalently, and in one application of the invention, the magnetic field may be intentionally varied in a time-dependent fashion, as by passing a current through the article emitting the magnetic field, or by moving the article and the sensors relative to each other in a time-varying fashion. Vector components and their spatial variation are calculated from the measurements made with the sensor/detector arrays.

The approach to calculating these values is as follows, in each case using the properly paired $B_p$ and $B_q$ values obtained as previously described. Using conventional vector calculations, $B_z$ is $B_p + B_q$ and $B_x$ is $B_p - B_q$. $B_y$ is obtained by rotating the support 32 by 90 degrees about the z axis, and repeating the measurements in a similar manner. A map of the spatial variation in B relative to the x and y axes and a map of the associated spatial gradients can be prepared using this approach and the vector gradient calculation procedures described previously, and scanning the support 32 past the surface 24, first parallel to the x axis and then parallel to the y axis. A similar calculational and scanning approach is used to obtain the variations with respect to the z axis, by making the x-axis and y-axis scans at different heights (values of z) above the surface.

A complete characterization of the magnetic field adjacent a surface may be time consuming, and the detailed geometry of the magnetic sensor coils must be taken into account. However, the data collection and analysis is fully automated and under computer control. Additionally, in many circumstances it is not necessary to obtain a map of every vector and gradient, reducing the amount of data and analysis that must be performed. The use of a programmable computer also has the advantage that a coarse analysis in large scanning steps can be performed initially to locate magnetic regions of greater interest, and then a detailed analysis of the region of interest can be performed using smaller scanning steps.

With the magnetometer of the invention, all components of the magnetic field and its gradients can be mapped at distances of as small as 0.1 millimeter from the surface of the object of interest. In such an approach, the sensors 56, 66 may be made about 100 micrometers on a side, and mounted so as to be about 100 micrometers from the article being measured, using conventional photolithographic techniques. The magnetometer utilizes the most sensitive approach known, the sensor/SQUID detector combination.

Although a particular embodiment of the invention has been described in detail for purposes of illustration, various modifications may be made without departing from the spirit and scope of the invention. Accordingly, the invention is not to be limited except as by the appended claims.

What is claimed is:

1. A magnetometer, comprising:
   a support having thereon two support surfaces that are perpendicular to each other and intersect each other along an intersection line, the support further having a reference axis that is perpendicular to the intersection line; and
   two planar sensor/detector arrays, one array mounted on each support surface, each array including at least two magnetic field sensors and associated detectors arranged such that the magnetic field sensors lie on a line that is parallel to the intersection line of the two support surfaces, wherein the detectors are superconducting quantum interference devices.

2. The magnetometer of claim 1, wherein the support surfaces are each inclined at an angle of more than zero and less than 90 degrees to the reference axis.

3. The magnetometer of claim 2, wherein the angle of inclination of each of the support surfaces is 45 degrees.

4. The magnetometer of claim 1, further including means for cooling the support.

5. The magnetometer of claim 1, further including means for moving the magnetometer in a direction perpendicular to the reference axis.

6. The magnetometer of claim 1, further including means for moving the magnetometer in a direction parallel to the reference axis.

7. The magnetometer of claim 1, further including means for rotating the magnetometer about the reference axis.

8. The magnetometer of claim 1, further including means for computing magnetic field vector components and their spatial variation from the information gathered by the sensor/detector arrays.

9. The magnetometer of claim 1, wherein at least a portion of the sensor/detector arrays is a high-temperature superconductor.

10. The magnetometer of claim 9, wherein the support body is hollow and the sensor/detector arrays are affixed to an end of the support body.

11. A magnetometer, comprising:
    a support having thereon two support surfaces that intersect along an intersection line, the support further having a reference axis that is not parallel to the intersection line;
    two sensor/detector arrays, one array mounted on each support surface, each array including at least two magnetic field sensors and associated SQUID detectors, each SQUID detector having an output signal; and
    means for calculating sums and differences of the output signals of the SQUID detectors.

12. The magnetometer of claim 11, wherein the magnetic field sensors of each array lie on a line that is perpendicular to the reference axis of the support.

13. The magnetometer of claim 11, further including means for cooling the sensor/detector arrays.

14. A method for measuring the vector components and spatial gradients of a magnetic field, comprising the steps of:
    providing a magnetometer including
       a support having thereon two support surfaces that intersect each other along an intersection line, the support further having a reference axis that is perpendicular to the intersection line, wherein the two support surfaces are perpendicular to each other and are each inclined at an angle of 45 degrees to the reference axis; and
       two planar sensor/detector arrays, one array mounted on each support surface, each array including at least two magnetic field sensors and associated detectors arranged such that the magnetic field sensors lie on a line that is parallel to the intersection line of the two support surfaces;
    providing relative motion between the magnetometer and a magnetic field and making measurements of the magnetic field using the sensor/detector arrays; and
    calculating vector components and their spatial variation from the measurements made with the sensor/detector arrays.

15. The method of claim 14, wherein, in the step of moving, the magnetometer is moved in a direction that is both perpendicular to the reference axis and perpendicular to the intersection line of the support surfaces.

16. The method of claim 14, wherein, in the step of moving, the magnetometer is moved in a direction parallel to the reference axis.

17. The method of claim 14, wherein, in the step of moving, the magnetometer is rotated about the reference axis.

18. The method of claim 14, wherein a source of the magnetic field is moved relative to the magnetometer, which is stationary, in the step of providing a relative motion.

19. A magnetometer, comprising:
    a support having thereon two support surfaces that are perpendicular to each other and intersect each other along an intersection line, the support further having a reference axis that is perpendicular to the intersection line;
    two planar sensor/detector arrays, one array mounted on each support surface, each array including at least two magnetic field sensors and associated detectors arranged such that the magnetic field sensors lie on a line that is parallel to the intersection line of the two support surfaces; and
    means for calculating the sums and differences of the output signals of the detectors.

* * * * *